United States Patent [19]

Allen

[11] 4,132,906

[45] Jan. 2, 1979

[54] CIRCUIT TO IMPROVE RISE TIME AND/OR REDUCE PARASITIC POWER SUPPLY SPIKE CURRENT IN BIPOLAR TRANSISTOR LOGIC CIRCUITS

[75] Inventor: Gordon H. Allen, Mesa, Ariz.

[73] Assignee: Motorola, Inc., Schaumburg, Ill.

[21] Appl. No.: 772,709

[22] Filed: Feb. 28, 1977

[51] Int. Cl.² .......................................... H03K 17/00
[52] U.S. Cl. .................... 307/254; 307/214; 307/270; 307/300
[58] Field of Search ............... 307/270, 300, 214, 215, 307/254; 330/15

[56] References Cited

U.S. PATENT DOCUMENTS

| 3,194,979 | 7/1965 | Toy ....................................... 307/300 |
| 3,531,660 | 9/1970 | Engberg .............................. 307/270 |
| 3,824,408 | 7/1974 | Brunel ................................. 307/300 |
| 3,958,136 | 5/1976 | Schroeder ........................... 307/270 |
| 4,006,370 | 2/1977 | Erler ................................... 307/300 |

Primary Examiner—John Zazworsky
Assistant Examiner—B. P. Davis
Attorney, Agent, or Firm—Robert D. Lott

[57] ABSTRACT

An improvement in output rise time and a reduction in the parasitic power supply strike current is achieved in bipolar transistor logic circuits using an AC coupled feedback circuit. During the low to high transition of the output, an internal voltage is AC coupled to an amplifier which in turn provides a low impedance path at the base of a lower output drive transistor which is coming out of conduction.

13 Claims, 1 Drawing Figure

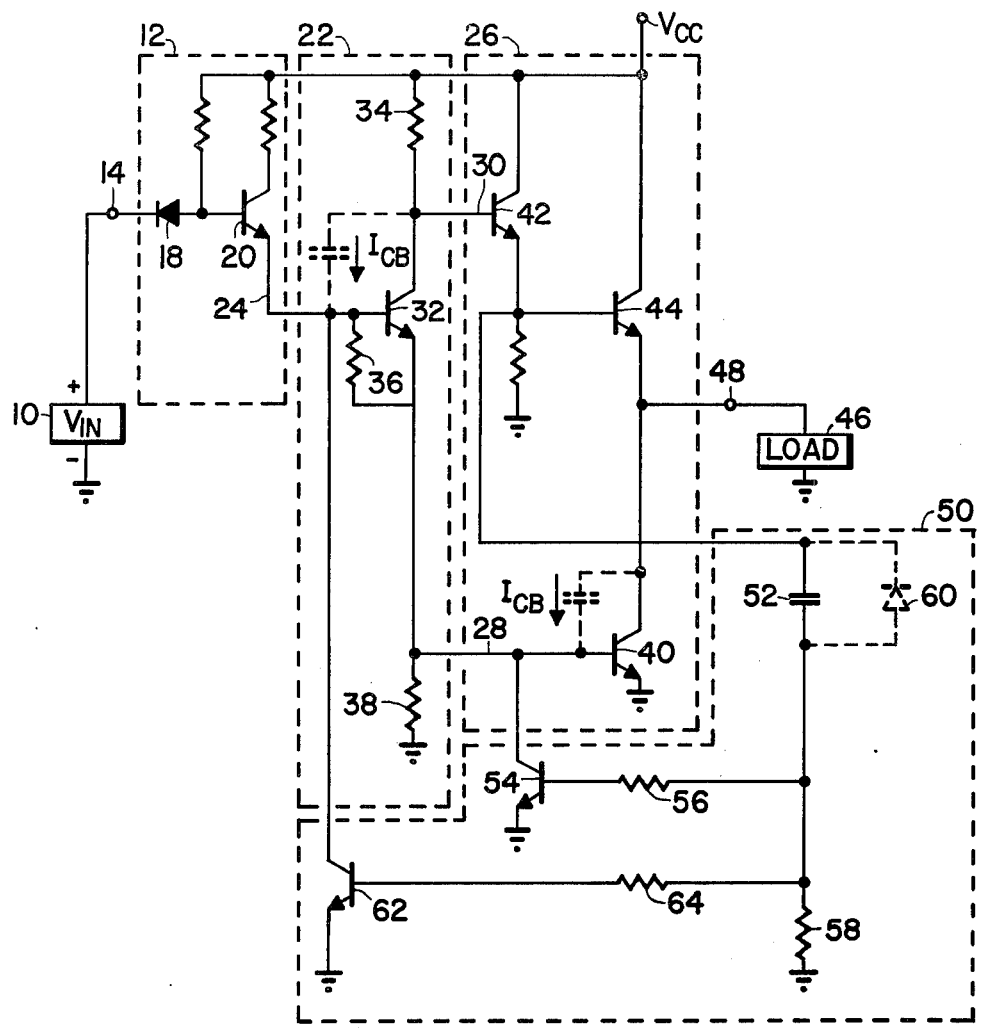

CIRCUIT TO IMPROVE RISE TIME AND/OR REDUCE PARASITIC POWER SUPPLY SPIKE CURRENT IN BIPOLAR TRANSISTOR LOGIC CIRCUITS

BACKGROUND OF THE INVENTION

This invention relates to the field of logic circuits, more particularly in the area of output driver circuits using bipolar transistors.

Present push-pull output drive stages of bipolar transistor logic circuits comprise a dual transistor arrangement wherein a first transistor, which is called an upper transistor, is disposed between a DC voltage supply and an output load, and a second transistor, which is called a lower transistor, is disposed between the output load and ground. In operation a high output voltage is realized at the output terminal by turning on the upper transistor and turning off the lower transistor, and a low output voltage is realized by turning off the upper transistor and turning on the lower transistor.

In order to be able to supply large amounts of current to the load in as short a time as possible to thereby provide fast switching speeds, these output driver transistors have relatively large geometries as compared to other transistors in the logic circuit. However these large geometries give rise to problems during the turn-off of these transistors. The large geometries result in higher amount of base charge in the transistors during conduction which must be removed before the transistor will turn off, and also result in higher collector to base capacitance which can AC couple collector current into the base to turn on the transistor.

The collector to base capacitance problem is especially acute when a low capacitive load is connected to the output terminal. Since the amount of current passing across the collector to base capacitance is proportional to the rate of change of the collector to base voltage, a low capacitance load will allow the output to rise rapidly which in turn will place a fast transient voltage on the collector of the lower transistor. Thus a large amount of current is coupled into the base of the transistor while it is coming out of conduction. This current into the base of the lower output transistor will tend to turn the transistor back on so that for a period of time both the upper and lower output driver transistors are carrying current directly from the power supply through the two transistors to ground. As a result there may be current spikes drawn from the power supply which in turn waste power and introduce noise into the rest of the system. Moreover a discontinuity may occur on the output voltage which can cause the following circuits to change states twice during the single transition of the drive circuit. Finally a current spike through the transistors may cause the transistors to heat up which in turn tends to increase the Beta of the devices which causes more collector current to flow to in turn cause more heating. Under certain conditions the circuit can enter thermal runaway and destroy itself. This thermal destruction is a cause of reliability problems with present circuits.

In the past a relatively lower resistance at the base of the lower output driver transistor has been used to drain off the charge in the base of the transistor and to provide a path for the parasitic base current from the collector to base capacitance. However the lower limit of this resistance is established by other circuit parameters such as the specified DC current which can be drawn from the power supply while the output is in the low state, the increased current sourcing requirements of the previous driver transistor, and the problems associated with the larger geometries for that device. Another approach to the solution of this problem utilizes a separate DC coupled circuit which provides a lower impedance at the base of the lower output driver transistor during transitions from low to high of the output voltage. However this circuit has limited current sinking capabilities and also requires additional DC power for the added circuit. Also, to meet the general specifications of the TTL logic family, the DC coupled circuit is complex and requires an appreciable portion of an integrated circuit chip area.

Therefore it can be appreciated that a relatively simple circuit which would provide a low impedance at the base of a lower output driver transistor while the output is changing from the low state to the high state is highly desirable.

Accordingly, it is an object of this invention to provide a means of improving the rise time of a bipolar transistor logic circuit under low capacitive load conditions.

It is also an object of this invention to provide a means for preventing a multiple transition indication to the following circuitry during a single transition of the driver circuit.

It is still another object of this invention to provide a means for improving the speed power product in a bipolar transistor logic circuit.

It is still another object to provide a circuit to improve the reliability of bipolar transistor logic circuits under low capacitive load conditions.

It is another object of this invention to provide a circuit which places a low impedance at the base of the lower output driver circuit coming out of conduction and which does not use any quiescent DC power.

SUMMARY OF THE INVENTION

A bipolar logic circuit is provided wherein an input stage and a phase splitting stage provide an in-phase signal and an out-of-phase signal to a push-pull output driver stage in response to an input logic signal. A transient signal derived from the output driver stage is coupled to the in-phase signal during transitions at the output of the output driver stage from the low voltage state to the high voltage state to aid in turning off the switching means of the output driver stage that is coming out of conduction.

BRIEF DESCRIPTION OF THE DRAWING

The FIGURE is a circuit diagram of a preferred embodiment of the invention.

DESCRIPTION OF THE PREFERRED EMBODIMENT

The FIGURE shows a source of input logic signals 10 coupled to the input stage 12 of a bipolar logic circuit incorporating the present invention. The input stage 12 has an input terminal 14 for receiving an input logic signal. The input logic signal is coupled through a diode 18 into the base of a transistor 20 wherein the input is amplified and transferred to a phase splitting stage 22 on line 24. It should be noted that certain resistors are not specifically called out in the description of the circuit of the FIGURE. These resistors provide biasing for the devices of the circuit and are relatively conventional in operation.

In order to drive a push-pull output driver stage 26, the amplified input signal on line 24 is split by the phase splitter stage 22 into an in-phase signal at line 28 which has zero phase shift relative to the amplified input signal, and an out-of-phase signal at line 30 which is 180° out of phase with the amplified input signal. The phase splitter stage 22 comprises a transistor 32 and resistors 34, 36 and 38. The in-phase signal at line 28 is connected directly to a lower output driver transistor 40 of the push-pull output stage 26. The out-of-phase signal appearing at line 30 is amplified by an intermediate transistor 42 and subsequently coupled to an upper output driver transistor 44. Transistors 40 and 44 of the output stage are therefore driven in a push-pull manner to in turn drive a load 46 coupled to the output terminal 48.

The circuit as described so far is conventional and well known to one skilled in the art. To improve the switching performance of this conventional circuit, an AC feedback circuit 50 consisting of a capacitive means 52 which couples the AC or transient voltage at the base of the upper output driver transistor 44 into the base of an AC amplifier transistor 54 through a base current limiting resistor 56. The amplified AC or transient signal from the AC amplifier transistor 54 is connected to the base of the lower output driver transistor 40. A capacitor discharge resistor 58 provides a DC path from the junction of the limiting resistor 56 and the capacitive means 52 to ground. The capacitance 52 in the preferred embodiment is provided by a diode 60 which is back biased during the operation of the AC feedback circuit 50. In one modification of the preferred embodiment, a second AC amplifier transistor 62 and an associated base current limiting resistor 64 may be added. The output of the second AC amplifier transistor 62 is connected to the base of the transistor 32 of the phase splitting stage 22.

In operation, a low level input logic signal at the input terminal 14 causes the input diode 18 to conduct thereby drawing base current away from the transistor 20 of the input stage. Transistor 20 therefore becomes nonconducting and in turn supplies no base current to transistor 32 of the phase splitter stage 22. Transistor 32 in turn becomes nonconducting such that the in-phase signal at line 28 is pulled to ground by resistor 38. Thus the lower output driver transistor 40 does not have any base current and also becomes nonconducting. The out-of-phase signal at line 30 provides base current via resistor 34 into the base of the intermediate transistor 42, which in turn provides base current to the upper output driver transistor 44 to cause it to go into conduction. Thus with the upper output driver transistor 44 turned on and the lower output driver transistor 40 turned off the output terminal 48 provides a high level voltage to the load 46. Conversely when the input logic signal at terminal 14 is high, the input diode 18 is reverse biased which allows base current to drive the input transistor 20 into conduction which in turn supplies base current to transistor 32 of the phase splitter stage to place it into conduction. The current from the emitter of transistor 32 is in turn passed into the base of the lower output driver 40 via line 28. The collector current from transistor 32 pulls the collector of transistor 32 to a low voltage level such that the out-of-phase signal at line 30 does not supply current into the base of the intermediate transistor 42 thereby turning off transistor 42. With no base current from transistor 42 the upper output driver transistor 44 also turns off resulting in a low level at the output terminal 48. During both of these steady state conditions just described, the capacitive coupling diode 60 is reverse biased and no current passes through the diode under steady state conditions. Therefore the capacitor discharge resistor 58 ensures that the AC amplifier transistors 54 and 62 are turned off under steady state conditions. During the high to low transitions of the output voltage, the base of transistor 44 goes from a high level voltage condition to a low level voltage condition which attempts to pull current out of the base of the AC amplifier transistors 54 and 62 thus keeping the transistors in their nonconducting states. Thus under steady state conditions, and in high to low transitions of the output voltage, the AC feedback circuit 50 does not draw any power and has essentially no effect on the rest of the circuit.

However during transitions of the output voltage from the low state to the high state the base of the upper output transistor 44 changes from a low level voltage to a high level voltage which in turn transfers a charge through the diode capacitance 60 through the base limiting resistor 56 and into the base of the AC amplifier transistor 54 to turn the transistor 54 on. The result is that the lower output driver transistor 40 has a lower impedance at its base to remove the base charge and also to drain away the parasitic base current which flows through the collector to base capacitance of the lower output driver transistor 40. The second AC amplifier transistor 62 and its associated base current limiting resistor 64 operate in the same manner to remove the base charge in the phase splitter transistor 32 and also to carry off the parasitic base current flowing through the collector to base capacitance of transistor 32. However the effect of adding the second AC amplifier transistor 62 and an associated base resistor 64 is only secondary, and circuits utilizing only the four elements of the basic AC feedback circuit consisting of the two resistors 56 and 58, diode 60, and transistor 54 have exhibited greatly reduced power supply current spikes during low to high transitions of the output voltage under low capacitive load conditions and have exhibited improved speed power products as compared to previous circuits with no additional circuitry, and also to logic circuits which employ a DC coupled circuit. Thus the present invention allows faster switching speeds without requiring any additional DC quiescent power. In addition, it is possible to increase the size of the resistor 38 at the base of the lower output driver transistor 40 by a factor of four in a circuit utilizing the present invention and still maintain the same switching speeds as compared to conventional circuits which do not have a separate circuit to help turn off the transistor that is coming out of conduction. Thus a designer has the flexibility of choosing to increase the switching speed of the output over conventional circuits, or to lower the DC power requirements of the circuit.

Finally, since the feedback circuit has reduced the tendency of the lower output driver transistor 40 to turn on after the upper output transistor 44 has gone into conduction, there are no multiple transitions in the output voltage during a positive transition at the output and thus no danger of multiple transitions of the following circuitry during a single transition of the driver circuit. Also reliability problems associated with thermal runaway due to current flowing directly from the power supply through both output driver transistors to ground are reduced.

While the invention has been particularly shown and described with reference to preferred embodiments thereof, it will be understood by those skilled in the art that various changes in form and details may be made therein without departing from the spirit and scope of the invention.

What is claimed is:

1. A circuit having an improved switching speed responsive to at least one input logic signal and being coupled to an output terminal comprising:
   (a) a first switching means responsive to the input logic signal for establishing a first logic level at the output terminal, said first switching means having at least an input electrode and an output electrode;
   (b) a second switching means coupled to said first switching means and responsive to a drive signal derived from the input logic signal for establishing a second logic level at the output terminal;
   (c) capacitive means connected to said input electrode for deriving a transient signal in response to a transition in the input logic signal;
   (d) means for coupling said transient signal to said second switching means for providing an alternate current path for said drive signal to help turn off said second switching means when said first switching means is switching from the nonconducting state to the conducting state.

2. A circuit as set forth in claim 1 wherein said means for coupling said transient signal to said second switching means further comprises an amplifier to amplify said derived transient signal.

3. A circuit as set forth in claim 1 wherein said first and second switching means are transistors.

4. A circuit as set forth in claim 3 further comprising a coupling means for interconnecting the emitter of said first switching transistor, the collector of said second switching transistor, and said output terminal to provide a push-pull driver to improve the switching speed of said circuit independent of the steady state level of the input logic signal.

5. A circuit as set forth in claim 1 further comprising:
   (a) a third switching means responsive to the input logic signal for providing drive to said second switching means;
   (b) means for coupling said transient signal to said third switching means for providing an alternate current path to help turn off said third switching means when said first switching means is switching from the nonconducting state to the conducting state.

6. A circuit as set forth in claim 5 wherein said means for coupling said transient signal to said third switching means further comprises an amplifier to amplify said derived transient signal.

7. A circuit as set forth in claim 5 wherein said first, second, and third switching means are transistors.

8. A circuit having an improved switching speed responsible to at least one input logic signal and coupled to a load at an output terminal, comprising:
   (a) an input stage with means for receiving said input logic signals and generating an amplified input signal;
   (b) a phase splitting stage coupled to said input stage for splitting said amplified input signal into a first split phase signal which is in phase with said amplified input signal, and a second split phase signal which is 180° out of phase with said amplified input signal;
   (c) a first output driver stage comprising a first amplifier and a second amplifier connected serially for amplifying said second split phase signal to drive the load;
   (d) a second output driver stage comprising an amplifier for amplifying said first split phase signal, the output of said second output driver coupled to the output of said first output driver and the load for driving the load in a push-pull manner;
   (e) means for deriving a transient signal;
   (f) means for coupling said transient signal to said second split phase signal at the input to said second output driver stage during transitions at said output terminal from a low voltage level to a high voltage level to assist in turning off said second output driver stage.

9. A circuit as set forth in claim 8 wherein said means for deriving said transient signal comprises a capacitive means.

10. A circuit as set forth in claim 8 wherein said means for coupling said transient signal to said second split phase signal further comprises an amplifier to amplify said derived transient signal.

11. A circuit as set forth in claim 8 wherein said amplifiers of said stages are transistor amplifiers.

12. A circuit as set forth in claim 11 wherein said phase splitting stage comprises a transistor amplifier.

13. A circuit as set forth in claim 12 further comprising a means for coupling said transient signal to the input of said phase splitting stage to assist in turning off said phase splitting transistor amplifier.

* * * * *